(12) United States Patent
Kim et al.

(10) Patent No.: US 8,050,118 B2
(45) Date of Patent: Nov. 1, 2011

(54) SEMICONDUCTOR MEMORY DEVICE

(75) Inventors: Kyung-Whan Kim, Kyoungki-do (KR); Seok-Cheol Yoon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/876,690

(22) Filed: Sep. 7, 2010

(65) Prior Publication Data

US 2010/0329050 A1    Dec. 30, 2010

Related U.S. Application Data

(62) Division of application No. 11/956,822, filed on Dec. 14, 2007, now Pat. No. 7,813,211.

(30) Foreign Application Priority Data

Mar. 22, 2007    (KR) .................. 10-2007-0027923

(51) Int. Cl.
*G11C 7/00*    (2006.01)
*G11C 8/00*    (2006.01)

(52) U.S. Cl. .................. 365/193; 365/194; 365/230.03; 365/230.08; 365/233.1

(58) Field of Classification Search .............. 365/185.05, 365/193, 194, 230.03, 230.08, 233.1
See application file for complete search history.

(56) References Cited

U.S. PATENT DOCUMENTS

| | | | |
|---|---|---|---|
| 6,385,127 B1 * | 5/2002 | Ikeda | 365/194 |
| 6,483,769 B2 * | 11/2002 | La | 365/194 |
| 6,839,291 B2 * | 1/2005 | Shin | 365/194 |
| 7,149,134 B2 * | 12/2006 | Streif et al. | 365/194 |
| 7,248,512 B2 * | 7/2007 | Shin | 365/194 |
| 7,283,421 B2 * | 10/2007 | Lee | 365/194 |
| 7,292,486 B2 * | 11/2007 | Lee | 365/194 |
| 7,495,973 B2 * | 2/2009 | Jung et al. | 365/194 |
| 7,522,467 B2 * | 4/2009 | An | 365/194 |
| 7,609,584 B2 * | 10/2009 | Kim et al. | 365/194 |
| 7,663,946 B2 * | 2/2010 | Kim | 365/194 |
| 7,668,038 B2 * | 2/2010 | Kim | 365/194 |
| 7,706,196 B2 * | 4/2010 | Kim et al. | 365/194 |
| 7,710,804 B2 * | 5/2010 | Ko | 365/194 |
| 7,813,211 B2 * | 10/2010 | Kim et al. | 365/194 |
| 7,835,204 B2 * | 11/2010 | Kim et al. | 365/194 |
| 7,839,705 B2 * | 11/2010 | Park | 365/193 |

* cited by examiner

*Primary Examiner* — Trong Phan
(74) *Attorney, Agent, or Firm* — IP & T Group LLP

(57) ABSTRACT

A semiconductor memory device having read and write operations includes a discrimination signal generating unit for generating a discrimination signal during the write operation; and a selective delay unit for receiving and selectively delaying a command-group signal in response to the discrimination signal.

14 Claims, 4 Drawing Sheets

US 8,050,118 B2

SEMICONDUCTOR MEMORY DEVICE

CROSS-REFERENCES TO RELATED APPLICATIONS

This application is a division of U.S. patent application Ser. No. 11/956,822 filed on Dec. 14, 2007 now U.S. Pat. No. 7,813,211, which claims priority of Korean patent application number 10-2007-0027923 filed on Mar. 22, 2007. The disclosure of each of the foregoing applications is incorporated herein by reference in its entirety.

BACKGROUND OF THE INVENTION

The present invention relates to a semiconductor memory device, and more particularly, to a semiconductor memory device capable of improving address access time (tAA) characteristics which denote a quality factor showing how fast data are outputted on inputting of a read command, and determines performance of the semiconductor memory device.

FIG. 1 is a block diagram of a conventional semiconductor memory device having first to eighth banks.

As the storage capacity of semiconductor memory devices have increased and the use of high performance memory devices such as double duty rate III (DDR3) dynamic random access memory (DRAM) devices have become more popular, semiconductor memory devices have changed from a four-bank structure to an eight-bank structure. In semiconductor memory devices, a part corresponding to a data input/output pad is called a "DQ pad" and a part corresponding to an address and command input/output pad is called an "AC pad".

As shown in FIG. 1, a plurality of DQ pads are located together at one side of a chip, and a plurality of AC pads are located together at another side of the chip. Herein, the first to eighth banks are distant from or close to the DQ pads according to their positions, and the first to eighth banks are also distant from or close to the AC pads according to their positions. As shown, the sixth bank BANK5 and the eighth bank BANK7 are grouped together with reference symbol "DQ WORST CMD BEST" and are distant from the DQ pads but close to the AC pads. In addition, the first bank BANK0 and the third bank BANK2 are grouped together with reference symbol "DQ BEST CMD WORST" and are distant from the AC pads but close to the DQ pads. Here, CMD is an abbreviation for "command."

FIG. 2 is a timing diagram illustrating a write operation of the first to eighth banks.

In detail, an upper portion of the timing diagram shows a write operation of the banks grouped as "DQ WORST CMD BEST" in fast process, voltage and temperature (PVT) conditions. A lower portion of the timing diagram shows a write operation of the banks grouped as "DQ BEST CMD WORST" in slow PVT conditions. Herein, fast PVT conditions, where the process is fast, the voltage is high and the temperature is low, correspond to good tAA characteristics, where the tAA characteristics denote a quality factor showing how fast data are outputted on inputting of a read command. Further, slow PVT conditions, where the process is slow, the voltage is low and the temperature is high, correspond to bad tAA characteristics.

Data to be written to the banks (hereinafter, referring to as "write data") are transferred from the DQ pads to the banks, and written to the banks in response to a bank enable signal BWEN. The write data are written to a memory cell at a column side in response to a column selection signal YS which is selected based on a column address. The column selection signal YS may be enabled at substantially the same time as an activation of the bank enable signal BWEN with a short time delay. Further, the column selection signal YS is delayed or advanced accordingly as the bank enable signal BWEN is advanced or delayed.

In general, as the write data transferred to the banks are intended to have the least delay time, the number of logic gates passed through by the write data is designed to be minimized. The write data are merely transferred to the banks via a long metal line, e.g., a global input/output (GIO) line. The GIO line may have the characteristic of an RC delay and a little variation between fast PVT conditions and slow PVT conditions. The GIO line is classified as a data-group transmission line, and thus the write data transferred via the GIO line are classified as a data-group signal. A time margin "$t_{GIO}$" shown in FIG. 2 denotes a time difference caused by PVT variation of the data-group signal.

On the contrary, the bank enable signal BWEN and the column selection signal YS, which are inputted to address and command input/output pads, i.e., the pads AC PADs shown in FIG. 1, and transferred to banks, i.e., the banks BANK 1-7 shown in FIG. 1, vary sensitively according to PVT conditions because they pass through a relatively large number of logic gates, e.g., a timing controlling circuit and other controllers, which are classified as a command-group transmission line between the pads AC PADs and the banks BANK 1-7. Such signals as the bank enable signal BWEN and the column selection signal YS are classified as command-group signals. A time margin "$t_{CMD}$" shown in FIG. 2 denotes a time difference caused by PVT variation of a command-group signal. Herein, the time margin "$t_{CMD}$" is larger than the time margin "$t_{GIO}$".

It is required that data-group signals such as the write data reach the banks prior to command-group signals such as the bank enable signal BWEN and the column selection signal YS, for guaranteeing the timing margin "$t_{MARGIN}$" shown in FIG. 2. However, the command-group signal varies sensitively according to the PVT conditions, and thus, the command-group signal is faster than the data-group signal in fast PVT conditions. Because of this, sometimes the timing margin "$t_{MARGIN}$" cannot be guaranteed. Accordingly, it is required that the command-group signal may be delayed for a predetermined time by design. In particular, in the case of the banks grouped as "DQ WORST CMD BEST" as shown in the upper portion of the timing diagram of FIG. 2, it is necessary for the command-group signals such as the bank enable signal BWEN and the column selection signal YS to be delayed.

The lower portion of the timing diagram shown in FIG. 2 shows the write operation of the banks grouped as "DQ BEST CMD WORST" in slow PVT conditions. In such conditions, the command-group signals such as the bank enable signal BWEN and the column selection signal YS are transferred very slowly to the banks, but data-group signals such as the write data are transferred to the banks relatively faster than the command-group signals. This is because the data-group signals are transferred to the banks located at "DQ BEST CMD WORST" and varies insensitively according to the PVT conditions, while the command-group signals are transferred to the banks located at "DQ BEST CMD WORST" and delayed for the predetermined time by design for guaranteeing the timing margin "$t_{MARGIN}$" in the fast PVT conditions.

In a read operation as well as a write operation, the column selection signal YS is enabled so that read data are transferred to the GIO line from the banks. At this time, the tAA characteristics increase because the column selection signal YS is delayed as described above. The tAA characteristics mean a quality factor showing how fast the read data are outputted from inputting of a read command to thereby determine performance of the semiconductor memory device.

SUMMARY OF THE INVENTION

Embodiments of the present invention are directed to a semiconductor memory device capable of improving tAA characteristics, which denote a quality factor showing how fast data are outputted on inputting of a read command and which determine performance of the semiconductor memory device.

In accordance with an aspect of the present invention, there is provided a semiconductor memory device, including: a discrimination signal generating unit for generating a discrimination signal denoting that the semiconductor memory device is performing a write operation; and a selective delay unit for selectively delaying a command-group signal in response to the discrimination signal.

In accordance with another aspect of the present invention, there is provided a semiconductor memory device, including: a data-group transmission line for transferring data inputted to and outputted from a memory cell; and a command-group transmission line for transferring a command-group signal including a command signal and an address signal, wherein the command-group transmission line has a larger delay in a write operation than in a read operation.

DESCRIPTION OF SPECIFIC EMBODIMENTS

Hereinafter, a semiconductor memory device capable of improving tAA characteristics in accordance with exemplary embodiments of the present invention will be described in detail with reference to the accompanying drawings.

Figure 1:
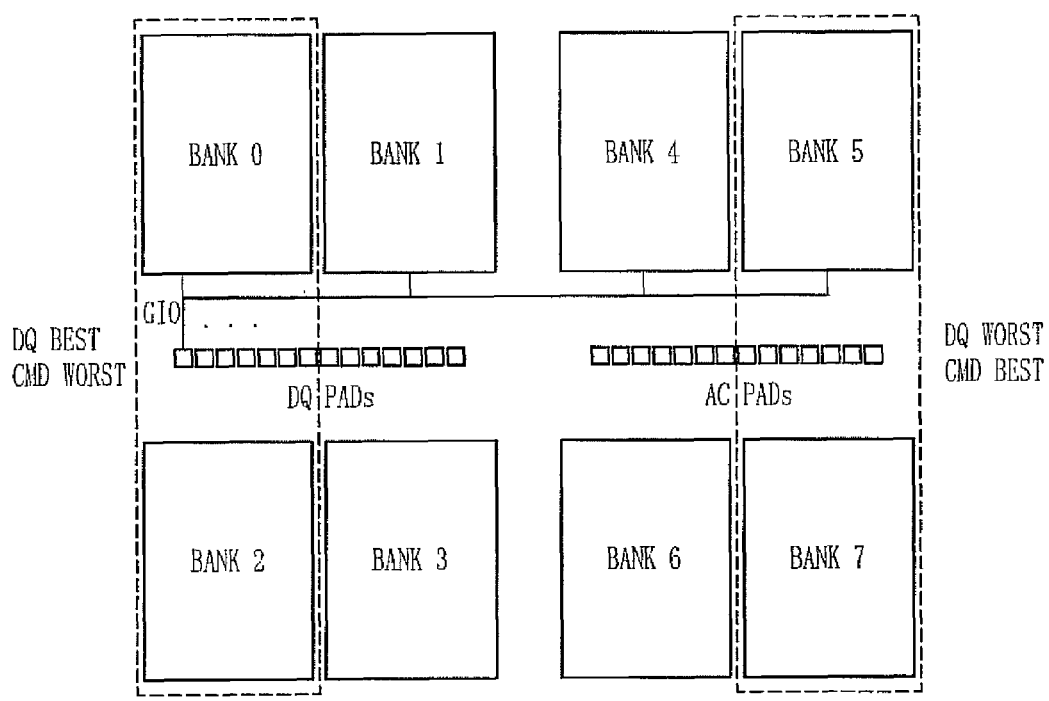
FIG. 1 is a block diagram of a conventional semiconductor memory device having eight banks.
Figure 2:
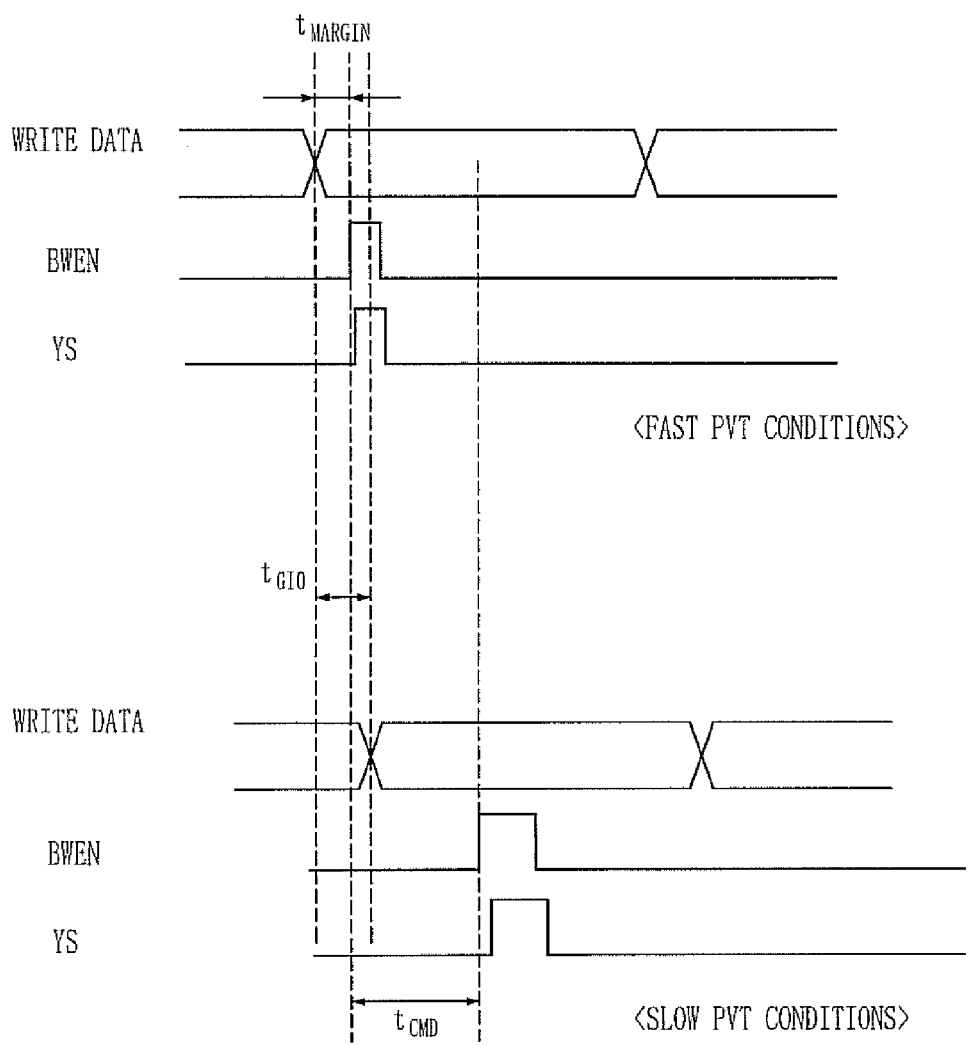
FIG. 2 is a timing diagram illustrating a write operation of the eight banks.
Figure 3:
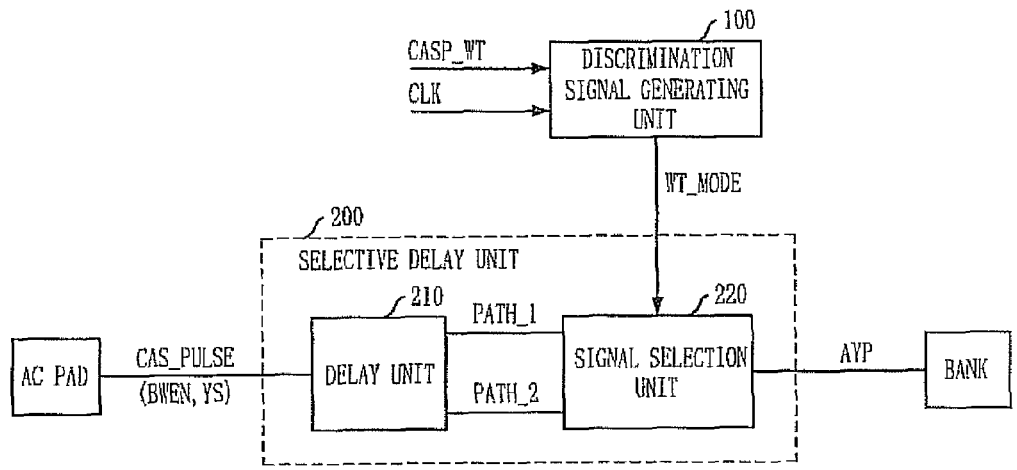
FIG. 3 is a schematic block diagram showing a command-group signal transmission line of a semiconductor memory device in accordance with an embodiment of the present invention.

FIG. 3 is a schematic block diagram showing a command-group signal transmission line of a semiconductor memory device, which can be used for a transmission line at an AC PAD of a semiconductor device in FIG. 1, in accordance with an embodiment of the present invention.

As shown, the command-group signal transmission line includes an AC PAD, a discrimination signal generating unit 100 and a selective delay unit 200, for improving tAA characteristics by selectively delaying a command-group signal CAS_PULSE.

The discrimination signal generating unit 100 generates a discrimination signal WT_MODE denoting a write operation. In the present invention, the command-group signal CAS_PULSE, including a bank enable signal BWEN and a column selection signal YS, is differently delayed according to whether the semiconductor memory device operates in a write operation or a read operation. That is, the discrimination signal generating unit 100 generates the discrimination signal WT_MODE using a clock signal CLK, denoting that the semiconductor memory device is performing a write operation, and thus the command-group signal CAS_PULSE can be delayed for a long delay period during the write operation.

The selective delay unit 200 selectively delays the command-group signal CAS_PULSE in response to the discrimination signal WT_MODE. In detail, the selective delay unit 200 increases a delay of the command-group signal CAS_PULSE when the semiconductor memory device is performing a write operation and thus the discrimination signal WT_MODE is enabled. The selective delay unit 200 decreases a delay of the command-group signal CAS_PULSE when the discrimination signal WT_MODE is disabled.

The selective delay unit 200 includes a delay unit 210 and a signal selection unit 220. The delay unit 210 delays the command-group signal CAS_PULSE to output first and second delayed command signals PATH_1 and PATH_2. The signal selection unit 220 selects one of the first and second delayed command signals PATH_1 and PATH_2 in response to the discrimination signal WT_MODE to output the selected one as a source signal AYP to a bank BANK of the semiconductor device.

Figure 4:
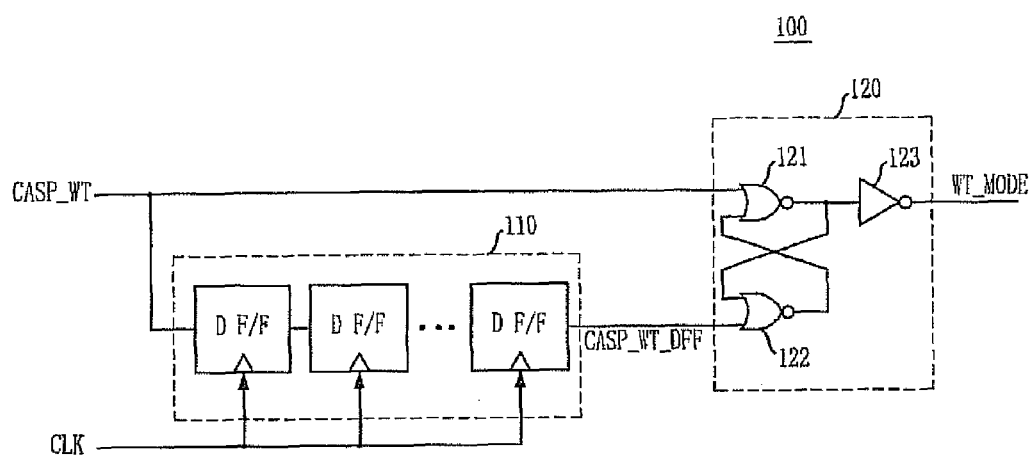
FIG. 4 is a circuit diagram of a discrimination signal generating unit shown in FIG. 3 in an embodiment of the present invention.

FIG. 4 is a circuit diagram of the discrimination signal generating unit 100 shown in FIG. 3 in an embodiment of the present invention.

The discrimination signal generating unit 100 generates the discrimination signal WT_MODE, denoting a write operation. The discrimination signal WT_MODE can be generated by combining one or more signals relating to the write operation.

In accordance with the embodiment of the present invention, the discrimination signal WT_MODE is generated based on an internal write command signal CASP_WT. The internal write command signal CASP_WT is a pulse signal generated by a column address strobe (CAS) command signal corresponding to a write command. The internal write command signal CASP_WT is enabled during the write operation.

Each time the internal write command signal CASP_WT is enabled, the discrimination signal WT_MODE is enabled for a preset time and then disabled. Herein, the preset time means a time interval for the write operation. Because the internal write command signal CASP_WT is a pulse that is enabled only for a short time, it is difficult for the semiconductor memory device to guarantee the time interval for the write operation. Thus, the discrimination signal WT_MODE is adjusted so as to be enabled at substantially the same time as the internal write command signal CASP_WT, and disabled after the preset time, to guarantee the time interval for the write operation. Because the command-group signal CAS_PULSE is delayed while the discrimination signal WT_MODE is enabled, the time when the discrimination signal WT_MODE is enabled is important.

Referring to FIG. 4, the discrimination signal generating unit 100 includes a delay unit 110 and a latch unit 120. The delay unit 110 delays the internal write command signal CASP_WT to output a delayed write command signal CASP_WT_DFF in response to the clock signal CLK. The latch unit 120 latches the internal write command signal CASP_WT based on the delayed write command signal CASP_WT DFF to output the latched signal as the discrimination signal WT_MODE.

The delay unit 110 includes one or more D flip-flops connected in series. The delay induced by the delay unit increases as the number of the D flip-flops increases.

The latch unit 120 may be implemented with a set-reset (SR) latch. The latch unit 120 includes first and second NOR gates 121 and 122, and an inverter 123. The first NOR gate 121 performs a NOR operation on the internal write command signal CASP_WT and an output signal of the second NOR gate 122. The second NOR gate 122 performs a NOR operation on the delayed write command signal CASP_WT_DFF and an output signal of the first NOR gate 121, to thereby form a SR latch with the first NOR gate 121. The inverter 123 inverts the output signal of the first NOR gate 121 to output the discrimination signal WT_MODE.

Figure 5:
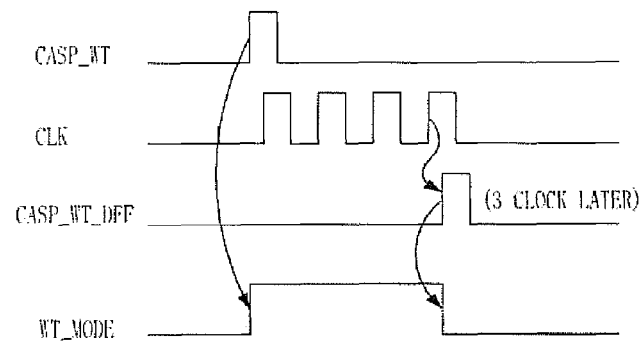
FIG. 5 is a timing diagram demonstrating an operation of the discrimination signal generating unit shown in FIG. 4.

FIG. 5 is a timing diagram demonstrating the operation of the discrimination signal generating unit 100 shown in FIG. 4.

As shown in FIG. 5, if the internal write command signal CASP_WT is enabled, the discrimination signal WT_MODE is enabled. After three clock periods of the clock signal CLK (labeled as "3 CLOCK LATER" in FIG. 5), the delay write command signal CASP_WT_DFF is enabled so that the discrimination signal WT_MODE is disabled.

Referring to FIG. 5, in the embodiment having the discrimination signal WT_MODE enabled for three clock periods, the time for which the discrimination signal WT_MODE is enabled may be changed and modified according to the duration of the write operation and the operating speed of the semiconductor memory device. Further, in the delay unit 110 using the D flip-flops and the latch unit 120 using the SR latch, the delay unit 110 may be implemented with an inverter delay, and the SR latch may be implemented with NAND gates rather than NOR gates.

Figure 6:
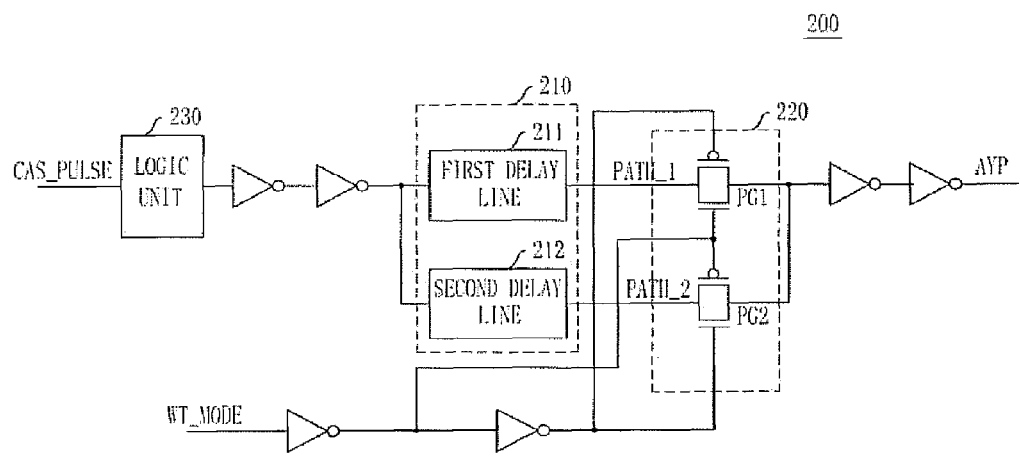
FIG. 6 is a circuit diagram of a selective delay unit shown in FIG. 3 in an embodiment of the present invention.

FIG. 6 is a circuit diagram of the selective delay unit 200 shown in FIG. 3 in an embodiment of the present invention.

As shown in FIG. 6, selective delay unit 200 includes a delay unit 210 and a signal selection unit 220. The delay unit 210 delays the command-group signal CAS_PULSE to output the first and second delayed command signals PATH_1 and PATH_2. The signal selection unit 220 selects one of the first and second delayed command signals PATH_1 and PATH_2 in response to the discrimination signal WT_MODE to output the selected one of the delayed command signals as a source signal AYP.

Hereinafter, prior to description of the elements, the signals shown in FIG. 6 are explained in detail.

First, the command-group signal CAS_PULSE is an initial command signal for a column access. In general, the command-group signal CAS_PULSE passes through a plurality of logic gates and is outputted as the source signal AYP.

The source signal AYP is one of the command-group signals used in order to generate the bank enable signal BWEN and the column selection signal YS. The relative timing of the bank enable signal BWEN and of the column selection signal YS is adjusted by controlling the timing of the source signal AYP. For reference, the internal write command signal CASP_WT can be generated based on the command-group signal CAS_PULSE.

Although the above signals used in the embodiment are explained as an example, it is important to increase the delay of the command-group signal during the write operation. Accordingly, it will be apparent to those skilled in the art that various changes and modifications may be made without departing from the spirit and scope of the invention.

The delay unit 210 includes first and second delay lines 211 and 212. The first delay line 211 is used for the read operation and the second delay line 212 is used for the write operation. Each of the first and second delay lines 211 and 212 delays the command-group signal CAS_PULSE by a different amount. In the present invention, it is important to increase the delay of the command-group signal CAS_PULSE during the write operation. Therefore, the delay produced by the second delay line 212 is larger than that produced by the first delay line 211.

Further, in the present invention, the difference between the delays produced by the first delay line 211 and the second delay line 212 is more important than the actual delays produced by the first and second delay lines 211 and 212. Accordingly, it is possible to set the delay of the first delay line 211 to zero by implementing the first delay line 211 as a line.

The signal selection unit 220 includes first and second pass gates PG1 and PG2, each of which receives a corresponding one of the output signals of the first and second delay lines 211 and 212.

The first and second pass gates PG1 and PG2 are enabled and disabled in response to the discrimination signal WT_MODE. In detail, when the discrimination signal WT_MODE is enabled, the second pass gate PG2 is enabled so that the source signal AYP is delayed by a time period equal to the delay of the second delay line 212, i.e., by a large amount. In addition, when the discrimination signal WT_MODE is disabled, the first pass gate PG1 is enabled so that the source signal AYP is delayed by a time period equal to the delay of the first delay line 211, i.e., by a small amount.

For reference, a logic unit 230 includes a plurality of logic gates that are passed through by the command-group signal CAS_PULSE for outputting the source signal AYP.

As described above, in conventional semiconductor memory devices, the command-group signal is delayed to guarantee the time margin of the write operation under fast PVT conditions by design. As a result, a deterioration in the tAA characteristics occurs in the read operation.

On the contrary, in the present invention, the command-group signal is delayed in the write operation for a predetermined delay time, which is longer than the delay in the read operation. Accordingly, the command-group signal is not meaninglessly delayed in the read operation, thereby improving the tAA characteristics that determine the performance of the semiconductor memory device.

While the present invention has been described with respect to specific embodiments, it will be apparent to those skilled in the art that various changes and modifications may be made without departing from the spirit and scope of the invention as defined in the following claims.

What is claimed is:

1. A semiconductor memory device, comprising:
    a discrimination signal generating unit for generating a discrimination signal indicating a write operation; and
    a selective delay unit for receiving and selectively delaying a command-group signal in response to the discrimination signal,
    wherein the selective delay unit is configured to delay the command-group signal for a write delay time in the write operation and delay the command-group signal for a read delay time in a read operation, and
    wherein the write delay time is longer than the read delay time and the write delay time is selected for delaying the command group signal in response to an activation of the discrimination signal.

2. The semiconductor memory device as recited in claim 1, wherein the selective delay unit includes:
    a dual delay unit for delaying the command-group signal by a first delay time to output a first delayed command signal and by a second delay time to output a second delayed command signal; and
    a signal selection unit for selecting one of the first and second delayed command signals in response to the discrimination signal.

3. The semiconductor memory device as recited in claim 2, wherein the first delay has a zero duration.

4. The semiconductor memory device as recited in claim 2, wherein the dual delay unit includes:
- a first delay line producing the first delay time to output the first delayed command signal; and
- a second delay line producing the second delay time, wherein the second delay time is longer than the first delay time, to output the second delayed command signal.

5. The semiconductor memory device as recited in claim 4, wherein the signal selection unit includes:
- a first pass gate for outputting the first delayed command signal; and
- a second pass gate for outputting the second delayed command signal.

6. The semiconductor memory device as recited in claim 5, wherein the first and second pass gates are selectively turned on or off in response to the discrimination signal.

7. The semiconductor memory device as recited in claim 1, wherein the discrimination signal generating unit generates the discrimination signal based on an internal write command signal.

8. The semiconductor memory device as recited in claim 7, wherein the discrimination signal generating unit enables the discrimination signal for a preset time duration after the internal write command is enabled.

9. The semiconductor memory device as recited in claim 8, wherein the preset time duration is a time interval for the write operation.

10. The semiconductor memory device as recited in claim 8, wherein the discrimination signal generating unit includes:
- a write command delay unit for delaying the internal write command signal to output a delayed write command signal; and
- a latch unit for latching the internal write command signal based on the delayed write command signal to output the discrimination signal.

11. The semiconductor memory device as recited in claim 10, wherein the write command delay unit includes at least one D flip-flop.

12. The semiconductor memory device as recited in claim 10, wherein the latch unit includes a set-reset (SR) latch.

13. The semiconductor memory device as recited in claim 12, wherein the SR latch includes:
- a first NOR gate;
- a second NOR gate;
  - wherein the first NOR gate performs a NOR operation on the internal write command signal and on an output signal of the second NOR gate, and
  - wherein the second NOR gate performs a NOR operation on the delayed write command signal and on an output signal of the first NOR gate, to form the SR latch with the first NOR gate, and
- an inverter for inverting the output signal of the first NOR gate to output the discrimination signal.

14. The semiconductor memory device as recited in claim 1, wherein the command-group signal includes a bank enable signal and a column selection signal.

\* \* \* \* \*